United States Patent
Hiraiwa et al.

(10) Patent No.: US 8,836,086 B2
(45) Date of Patent: Sep. 16, 2014

(54) SEMICONDUCTOR LIGHT EMITTING CHIP AND METHOD FOR PROCESSING SUBSTRATE

(75) Inventors: Daisuke Hiraiwa, Ichihara (JP); Takehiko Okabe, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 13/639,608

(22) PCT Filed: Feb. 16, 2011

(86) PCT No.: PCT/JP2011/053198
§ 371 (c)(1),
(2), (4) Date: Oct. 5, 2012

(87) PCT Pub. No.: WO2011/145370
PCT Pub. Date: Nov. 24, 2011

(65) Prior Publication Data
US 2013/0037825 A1 Feb. 14, 2013

(30) Foreign Application Priority Data
May 18, 2010 (JP) ................................. 2010-114282

(51) Int. Cl.
| | | |
|---|---|---|
| H01L 33/16 | (2010.01) | |
| H01L 33/00 | (2010.01) | |
| B23K 26/40 | (2014.01) | |
| B23K 26/00 | (2014.01) | |
| H01S 5/02 | (2006.01) | |
| H01L 33/20 | (2010.01) | |
| H01L 33/32 | (2010.01) | |
| H01S 5/32 | (2006.01) | |

(52) U.S. Cl.
CPC .............. *H01S 5/0202* (2013.01); *H01L 33/16* (2013.01); *H01L 33/0095* (2013.01); *B23K 26/4075* (2013.01); *H01S 5/0213* (2013.01); *H01L 33/20* (2013.01); *H01L 33/32* (2013.01); *B23K 26/0057* (2013.01); *B23K 2201/40* (2013.01); *H01S 5/3202* (2013.01)
USPC .............................. 257/628; 257/79; 257/798

(58) Field of Classification Search
CPC ... H01L 29/165; H01L 29/205; H01L 29/225; H01L 29/261
USPC .......... 257/628, 627, 77, 94, 99, E33.003, 79, 257/798
See application file for complete search history.

(56) References Cited

U.S. PATENT DOCUMENTS

| | | | |
|---|---|---|---|
| 5,864,171 A * | 1/1999 | Yamamoto et al. | ........... 257/628 |
| 6,080,599 A | 6/2000 | Yamamoto et al. | |
| 2009/0072250 A1 * | 3/2009 | Inoue | ............... 257/88 |
| 2010/0109035 A1 * | 5/2010 | Cho et al. | ........................ 257/98 |

FOREIGN PATENT DOCUMENTS

| | | |
|---|---|---|
| JP | 8-330628 A | 12/1996 |
| JP | 2003-338636 A | 11/2003 |
| JP | 2004-039931 A | 2/2004 |

* cited by examiner

*Primary Examiner* — Yu-Hsi D Sun
*Assistant Examiner* — Christina Sylvia
(74) *Attorney, Agent, or Firm* — Sughrue Mion, PLLC

(57) ABSTRACT

Disclosed is a semiconductor light emitting chip (20) that is composed of: a substrate (10), which has the C plane of a sapphire single crystal as the front surface, and the side surfaces (25, 26) configured of planes that intersect all the planes equivalent to the M plane of the sapphire single crystal, and which includes modified regions (23, 24) in the side surfaces (25, 26), the modified regions being formed by laser radiation; and a light emitting element (12), which is provided on the substrate front surface (10a) of the substrate (10). In the semiconductor light emitting chip, a tilt of the substrate side surfaces with respect to the substrate front surface is suppressed. Also disclosed is a method for processing the substrate.

3 Claims, 11 Drawing Sheets

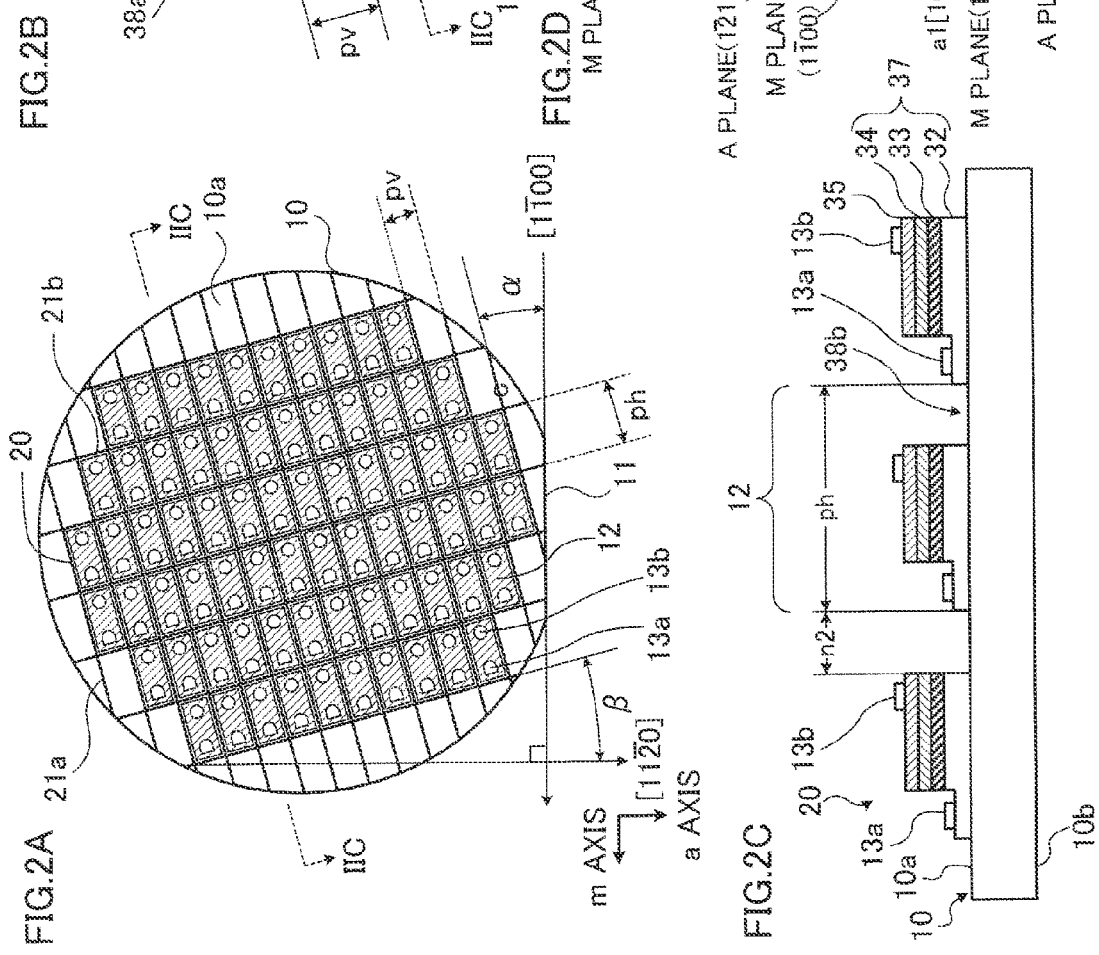

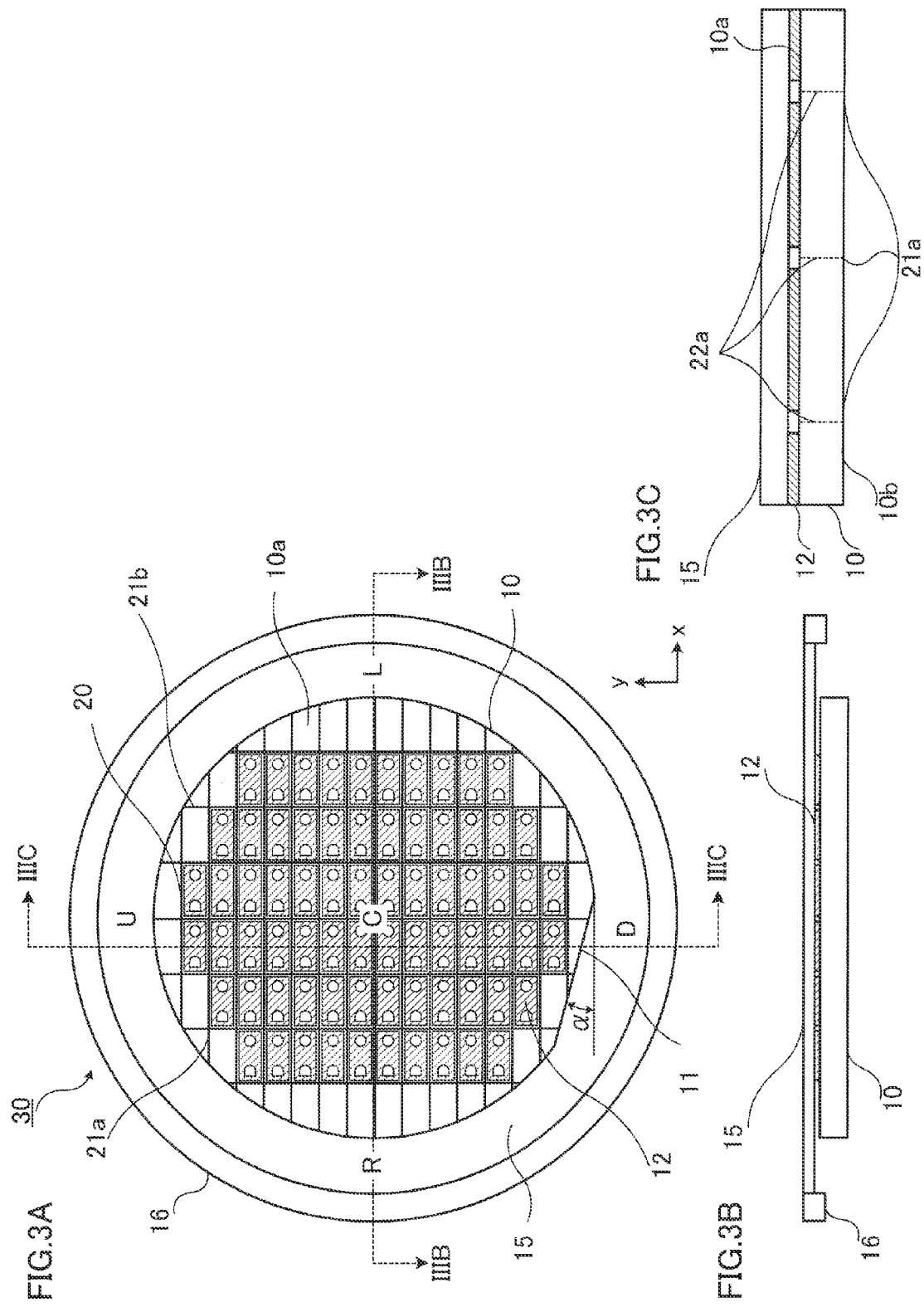

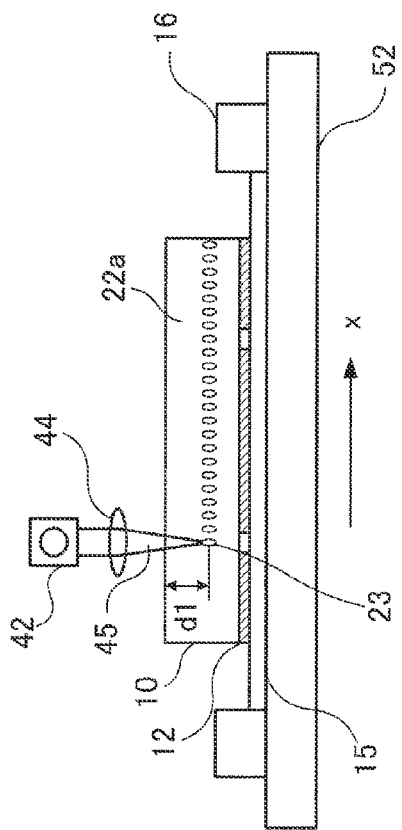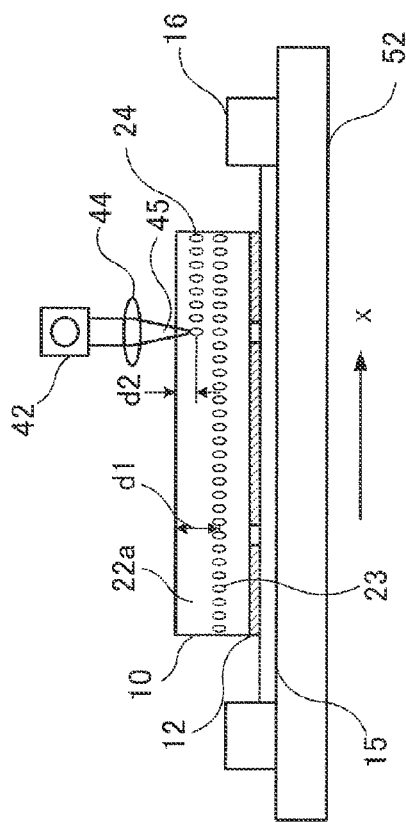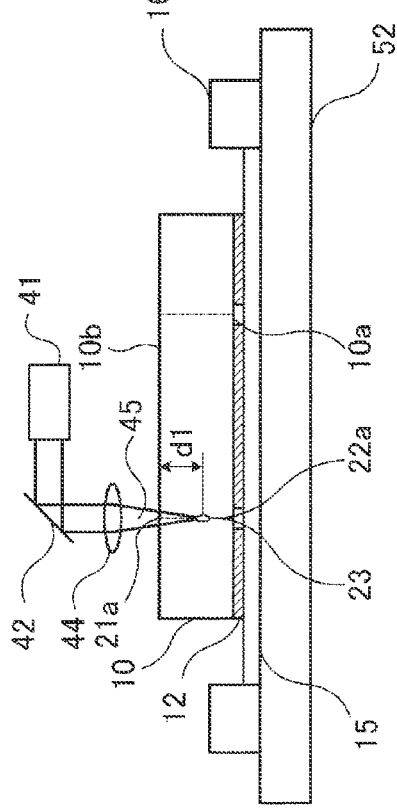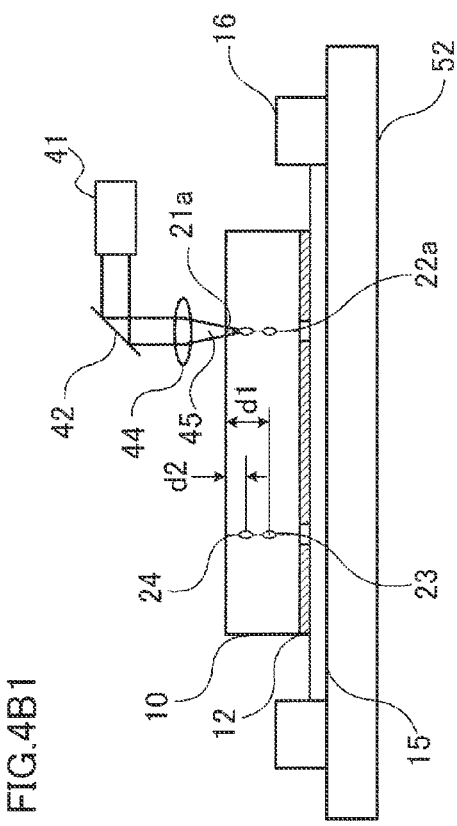

FIG.10

| | PREPARING CONDITION | | | | | | | | DIVIDING RESULT | | | | |
|---|---|---|---|---|---|---|---|---|---|---|---|---|---|
| | DIVIDING PITCH (μm) | | WIDTH OF DIVIDING GROOVE (μm) | | CROSSING ANGLE (°) | | DISTANCE (μm) | | ANGLE OF SIDE SURFACE (°) | | | | FAILURE (NG) RATE (%) |
| | ph | pv | n1 | n2 | α | β | d1 | d2 | θ1 | θ2 | θ3 | θ4 | |
| EXAMPLE 1 | 400 | 240 | 20 | 20 | 15 | 15 | 100 | 30 | 0.5 | 0.4 | 0.3 | 0.4 | 0.30 |
| EXAMPLE 2 | 400 | 240 | 30 | 30 | 15 | 15 | 100 | 30 | 0.3 | 0.5 | 0.3 | 0.2 | 0.05 |
| EXAMPLE 3 | 400 | 240 | 30 | 30 | 5 | 5 | 100 | 30 | 0.9 | 0.7 | 0.2 | 0.4 | 0.80 |
| EXAMPLE 4 | 400 | 240 | 30 | 30 | 25 | 25 | 100 | 30 | 0.7 | 0.5 | 0.4 | 0.3 | 0.70 |
| EXAMPLE 5 | 550 | 280 | 20 | 20 | 15 | 15 | 100 | 30 | 0.4 | 0.4 | 0.4 | 0.1 | 0.25 |
| EXAMPLE 6 | 350 | 350 | 20 | 20 | 15 | 15 | 100 | 30 | 0.3 | 0.4 | 0.2 | 0.3 | 0.15 |
| COMPARATIVE EXAMPLE 1 | 400 | 240 | 20 | 20 | 0 | 0 | 100 | 30 | 4.5 | 5.1 | 0.3 | 0.3 | 9.50 |
| COMPARATIVE EXAMPLE 2 | 400 | 240 | 30 | 30 | 0 | 0 | 100 | 30 | 4.3 | 4.8 | 0.4 | 0.3 | 3.20 |

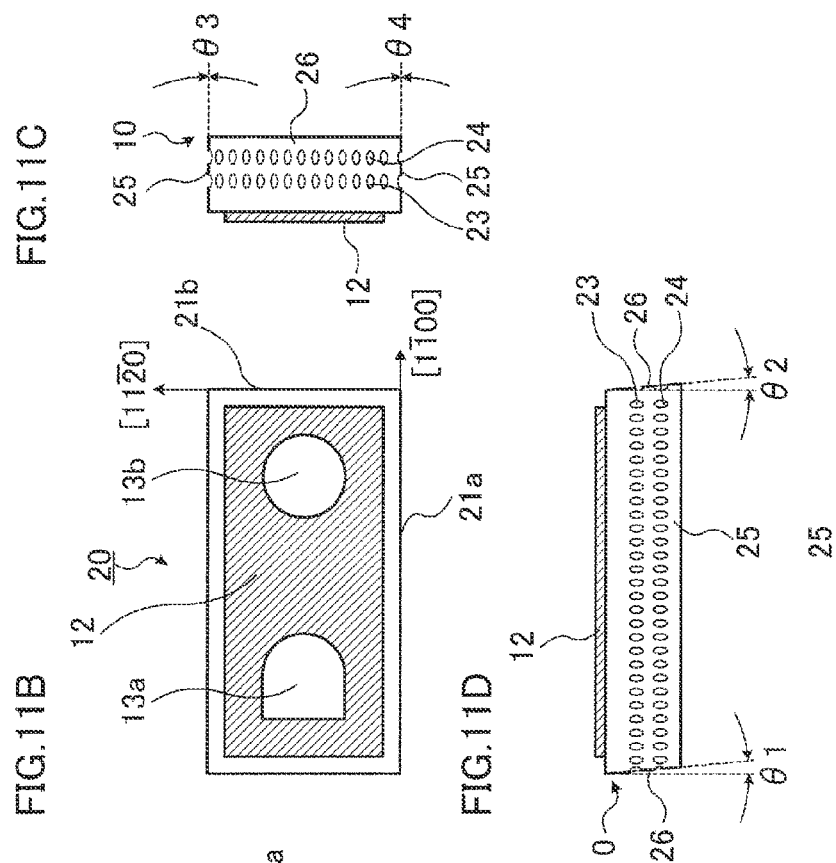

ent Application No. 2010-114282 filed May 18, 2010, the contents of all of which are incorporated herein by reference in their entirety.

SEMICONDUCTOR LIGHT EMITTING CHIP AND METHOD FOR PROCESSING SUBSTRATE

CROSS REFERENCE TO RELATED APPLICATIONS

This application is a National Stage of International Application No. PCT/JP2011/053198 filed Feb. 16, 2011, claiming priority based on Japanese Patent Application No. 2010-114282 filed May 18, 2010, the contents of all of which are incorporated herein by reference in their entirety.

TECHNICAL FIELD

The present invention relates to a semiconductor chip in which a substrate on which plural semiconductor light emitting elements are formed is processed into thin pieces (chips) and a method for processing the substrate into thin pieces (chips).

BACKGROUND ART

A substrate on which plural semiconductor light emitting elements such as light emitting diodes (LEDs) or semiconductor lasers are formed is cut to be divided into semiconductor light emitting chips on each of which a semiconductor light emitting element is mounted (hereinafter, referred to as light emitting chip). As a method for dividing into the light emitting chips, there is a method called a stealth dicing method that focuses laser light by an objective lens optical system, performs irradiation on an interior of a substrate along expected cutting lines assumed on the substrate to form modified regions having crystal strength lower than that before irradiation. In this method, the substrate is cut by starting from the modified regions to be divided into light emitting chips.

In Patent Document 1, there is disclosed a method for cutting a substrate into chips and a device therefor. In the method here, (1) grooves or work damaged layers that become starting points of breaking are formed by a laser, a scribe, a dicer or the like in advance on a substrate to be cut, (2) a blade having an acute-angle tip end is adjusted to contact an opposite surface of the grooves becoming the starting points for breaking, and (3) the blade is pushed into the substrate by application of an impactive force, to thereby cut the substrate by breaking.

Incidentally, if a sapphire single crystal is used as a substrate, though modified regions are formed within the substrate by the stealth dicing method (hereinafter, referred to as laser processing), there was a problem that side surfaces (cutting planes) of the substrate portion in a light emitting chip after being divided were inclined with respect to the surface of the substrate. Hereinbelow, a description will be given by use of FIG. 1.

FIG. 1 is a diagram illustrating crystal orientation of a sapphire single crystal.

The sapphire single crystal belongs to a hexagonal crystal, in which a top surface (bottom surface) of a hexagonal column constituted by an a1-axis, an a2-axis, an a3-axis and a c-axis is a C plane (0001), and all the side surfaces are an M plane (1-100) and planes equivalent to the M plane (M plane {1-100}). Hereinafter, the M plane and the planes equivalent to the M plane are collectively referred to as the M plane. A direction perpendicular to the M plane (1-100) is a [1-100] direction (m-axis). Here, "-" represents a bar above a number following "-".

A surface that includes a point of a coordinate "1" in each of the a1-axis and the a2-axis and is in parallel with the c-axis is an A plane (11-20).

Five surfaces, each of which includes a line alternately connecting other vertices of a hexagon of the top surface (bottom surface) of the hexagonal column and is in parallel with the c-axis, are surfaces equivalent to the A plane (A plane {11-20}). Hereinafter, the A plane and the planes equivalent to the A plane are collectively referred to as an A plane. A direction perpendicular to the A plane (11-20) is a [11-20] direction (a-axis).

In forming a light emitting chip whose surface shape is rectangular with a scribing method by use of a sapphire substrate, scribing grooves are formed so that one side of the light emitting chip is arranged in parallel with the m-axis direction of the sapphire substrate and another side is arranged in parallel with the a-axis direction of the sapphire substrate.

Next, the sapphire substrate is cleaved along the scribing grooves that are in parallel with the a-axis direction to form plural substrates having a rectangular shape. Then, the rectangular-shaped substrates are cleaved along the scribing grooves that are in parallel with the m-axis direction, to thereby produce light emitting chips each of which has a rectangular surface shape.

In the case where cleavage is performed along the planes that are in parallel with the m-axis direction, since the frequency of inclination of a cutting plane with respect to the surface of the substrate is low, the cutting plane of the substrate is within a cut region that is set to include an expected cutting line, and thereby plural rectangular-shaped substrates can be formed without causing the cutting plane to extend to the semiconductor light emitting element. On the other hand, in the direction in parallel with the a-axis of the above-described LED chip (easy-cleaving plane), the cutting plane is inclined with respect to the surface of the substrate to result in breaking, the cutting plane of the substrate extends off the cut region that is set to include an expected cutting line and extends to the semiconductor light emitting element, and thereby a problem of increasing a reverse current in the semiconductor light emitting element was caused.

CITATION LIST

Patent Literature

Patent Document 1: Japanese Patent Application Laid-Open Publication No. 2004-039931

SUMMARY OF INVENTION

Technical Problem

The present invention was made in light of the above-described circumstances, and an object of the present invention is to provide a semiconductor light emitting chip in which inclination of a side surface of a substrate with respect to a substrate front surface is suppressed, and a processing method of the substrate.

Solution to Problem

To achieve the above-described object, the present invention employed the following configuration.

According to a first aspect of the present invention, there is provided a semiconductor light emitting chip including: a substrate in which a C plane of a sapphire single crystal is assumed to be a front surface, and a side surface is configured with a plane that intersects any of planes equivalent to an M plane of the sapphire single crystal, the substrate including modified regions formed by laser irradiation in the side surface; and a semiconductor light emitting element provided on the front surface of the substrate.

According to a second aspect of the present invention, in the semiconductor light emitting chip of the first aspect, a surface shape of the semiconductor light emitting chip is a parallelogram.

According to a third aspect of the present invention, in the semiconductor light emitting chip of the first aspect, a surface shape of the semiconductor light emitting chip is a trapezoid.

According to a fourth aspect of the present invention, in the semiconductor light emitting chip of the first aspect, in the front surface of the substrate, a crossing angle of the side surface intersecting the M plane of the sapphire single crystal is 10° or more and 20° or less.

According to a fifth aspect of the present invention, there is provided a method for processing a substrate, in which a C plane of a sapphire single crystal is assumed to be a substrate front surface, and plural semiconductor light emitting elements are formed on the front surface, the method including: a step in which planes that are perpendicular to the front surface of the substrate and intersect any of planes equivalent to an M plane of the sapphire single crystal are assumed to be expected cutting planes, and dividing grooves are formed in interelement spacings between light emitting elements along the expected cutting planes; a laser processing step in which laser light is focused and applied in the expected cutting plane from one surface of the substrate to form modified regions within the substrate; and a breaking step in which the substrate is cut from the modified regions as starting points and divided into plural semiconductor light emitting chips, each of which includes the semiconductor light emitting element.

According to a sixth aspect of the present invention, in the method for processing a substrate of the fifth aspect, the modified regions are formed by scanning the substrate by the laser light.

According to a seventh aspect of the present invention, in the method for processing a substrate of fifth aspect, a surface shape of the semiconductor light emitting chips is a parallelogram.

According to an eighth aspect of the present invention, in the method for processing a substrate of fifth aspect, a surface shape of the semiconductor light emitting chips is a trapezoid.

According to a ninth aspect of the present invention, in the method for processing a substrate of fifth aspect, in the semiconductor light emitting chips, a width of the dividing groove provided along the expected cutting plane is 10 μm or more and 30 μm or less.

According to a tenth aspect of the present invention, in the method for processing a substrate of fifth aspect, the substrate includes an orientation flat that is in parallel with any one of the expected cutting planes.

According to an eleventh aspect of the present invention, there is provided a semiconductor light emitting chip produced by the method for processing a substrate of the fifth aspect.

Advantageous Effects of Invention

According to the present invention, it is possible to provide a method for processing a substrate in which inclination of a side surface (cutting plane) of the substrate with respect to a substrate front surface is suppressed and a semiconductor light emitting chip (light emitting chip) in which inclination of a side surface (cutting plane) of the substrate with respect to a substrate front surface is suppressed, the cutting plane does not extend to a light emitting portion, and reverse current is small.

BRIEF DESCRIPTION OF DRAWINGS

FIGS. 2A to 2D are diagrams for illustrating a step of a method for producing a semiconductor light emitting element, which is a first exemplary embodiment, and FIG. 2A is a plan view of a wafer at the time of forming dividing grooves, FIG. 2B is an enlarged plan view that indicates part of the wafer shown in FIG. 2A, FIG. 2C is a cross-sectional view taken along the line IIC-IIC in FIG. 2B, and FIG. 2D is a diagram illustrating a relation between a side of a light emitting chip and crystal orientation of a sapphire single crystal;

FIGS. 3A to 3C are diagrams illustrating a state where the substrate is bonded to an adhesive sheet held by a metal ring for forming modified regions within the substrate in the first exemplary embodiment by the laser processing;

FIGS. 4A1 to 4B2 are diagrams illustrating a method for forming the modified regions within the substrate in the first exemplary embodiment by the laser processing;

FIG. 10 is a diagram showing a dividing pitch, a width of a dividing groove, crossing angles α and β between an M plane and an A plane of a sapphire single crystal, distances d1 and d2 from a back surface of a substrate to modified regions formed by laser irradiation, inclination angles θ1 and θ2 of side surface in a short side direction of a light emitting chip 20, inclination angles θ3 and θ4 of side surface in a long side direction, and an incidence of defective (NG) pieces (%) in Examples and Comparative Examples; and FIGS. 11A to 11D are diagrams illustrating a shape of the light emitting chip in Comparative Examples.

DESCRIPTION OF EMBODIMENTS

Figure 1:
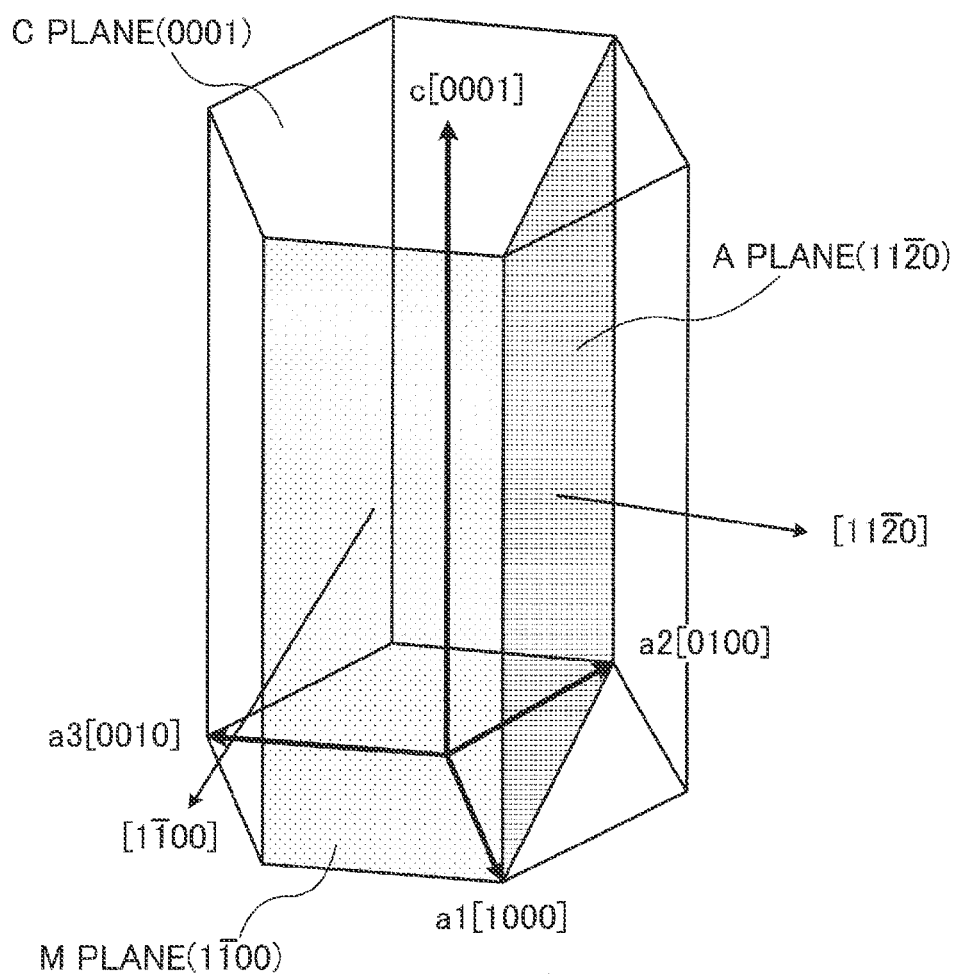
FIG. 1 is a diagram illustrating crystal orientation of a sapphire single crystal.

Hereinafter, exemplary embodiments according to the present invention will be described in detail with reference to accompanying drawings.

(First Exemplary Embodiment)

As a method for processing a substrate on which semiconductor light emitting elements are mounted, first, a specific example of a method for producing the semiconductor light emitting element will be described.

The method for producing a semiconductor light emitting element, which is an exemplary embodiment according to the present invention, includes: a step of forming plural light emitting elements, each having a rectangular plan-view shape (rectangle or square), on a sapphire substrate in a matrix state so that each side of the light emitting element intersects an a-axis of the substrate; a step of forming dividing grooves in interelement spacings between the light emitting elements;

and a step of dividing the substrate along the dividing grooves to cut the light emitting elements.

FIGS. 2A to 2D are diagrams for illustrating a step of the method for producing a semiconductor light emitting element, which is a first exemplary embodiment, and FIG. 2A is a plan view of a wafer at the time of forming the dividing grooves, FIG. 2B is an enlarged plan view that indicates part of the wafer shown in FIG. 2A, and FIG. 2C is a cross-sectional view taken along the line IIC-IIC in FIG. 2B. It should be noted that, in FIG. 2A, for making it easier to see the figure, illustration of dividing grooves 38a and 38b are omitted. FIG. 2D is a diagram illustrating a relation between the sides of a light emitting chip 20 and crystal orientation of a sapphire single crystal.

It should be noted that, in each figure used in the following description, characteristic part is enlarged for the sake of convenience in some cases for making it easier to conceive the characteristics, and therefore, the dimensional ratio between the components is not necessarily the same as the actual one.

First, on a surface of a substrate 10 (substrate front surface 10a), an epitaxial layer 37 of a group III nitride semiconductor is formed.

As the substrate 10, those composed of a sapphire single crystal, SiC single crystal or the like can be used. In the case of using a sapphire substrate as the substrate 10, it is desirable to assume the C plane ((0001) plane) as a principal plane (substrate front surface 10a). The plane direction of the substrate 10 may be provided with an off angle of 0° with respect to a crystal surface, or may be inclined to each other at an off angle. In the case of being provided with an off angle, 1° or less is applied as the off angle. In the present invention, it is simply said that the substrate front surface 10a is the C plane ((0001) plane), including the substrate front surface being provided with such an off angle.

At one end of the substrate 10, an orientation flat (OF) 11 (OF 11) that indicates crystal orientation of the substrate 10 is provided. The OF 11 is formed on (11-20) plane of the sapphire single crystal.

In the case where the epitaxial layer 37 is formed on the substrate 10, it is preferable to use the substrate 10 having a thickness of 300 μm to 1000 μm. If the thickness of the substrate 10 is less than 300 μm, the substrate 10 is warped in the course of growing of the epitaxial layer 37, which causes inconvenience. Further, if the thickness of the substrate 10 exceeds 1000 μm, much effort is required to make the substrate 10 thin by polishing after growing of the epitaxial layer 37.

In the case where the epitaxial layer 37 is formed on the substrate 10, it is preferable to form the epitaxial layer 37 via a buffer layer (illustration is omitted) on the substrate 10 and a base layer (illustration is omitted) formed on the buffer layer. Here, as the epitaxial layer 37 provided on the substrate 10, a layer composed of the group III nitride semiconductor can be provided as a representative example; however, the present invention is not limited thereto. It is also applicable to a light emitting element or a light receiving element composed of a material other than the group III nitride semiconductor.

The buffer layer is, for example, constituted by an aggregate of single crystals or columnar crystals of the group III nitride semiconductor, and is provided to mediate a difference in lattice constant between the substrate 10 and the epitaxial layer 37. Further, the base layer is composed of the group III nitride semiconductor, and the material of the base layer may be the same as or different from the buffer. Still further, the base layer may be doped with n-type impurities such as Si, Ge and Sn as necessary, but may also be undoped, and undoped one is preferred in terms of maintaining excellent crystallinity.

The epitaxial layer 37 includes, as shown in FIG. 2C, an n-type layer 32 including an n contact layer for forming an n-type electrode, a light emitting layer 33 that serves as a light emitting portion, and a p-type layer 34 including a p contact layer for forming a p-type electrode.

The n-type layer 32 is usually configured with the n-contact layer and an n-cladding layer. The n-contact layer can also serve as the n-cladding layer.

The n-contact layer is preferably configured with an $Al_xGa_{1-x}N$ layer (0≤x<1, preferably 0≤x≤0.5, and more preferably 0≤x≤0.1). Moreover, the n-contact layer is preferably doped with n-type impurities. As the n-type impurities, for example, Si, Ge, Sn and so on are provided, and Si and Ge are preferably provided.

It is preferable to provide the n-cladding layer between the n-contact layer and the light emitting layer 33. The n-cladding layer can be formed of AlGaN, GaN, GaInN and so on. It should be noted that, in this specification, AlGaN and GaInN are described with the compositional ratio of each element being omitted in some cases.

As the light emitting layer 33 laminated on the n-type layer 32, the light emitting layer 33 having a single quantum well structure or a multiple quantum well structure is provided. As a well layer having a quantum well structure, a group III nitride semiconductor layer composed of $Ga_{1-y}In_yN$ (0<y<0.4) is usually used. Moreover, in the case of the light emitting layer 33 having the multiple quantum well structure, the above-described $Ga_{1-y}In_yN$ is employed as the well layer, and $Al_zGa_{1-z}N$ (0≤z<0.3) having a band gap energy larger than that of the well layer is employed as a barrier layer. The well layer and the barrier layer may be doped or not doped with impurities depending upon a design thereof.

The p-type layer 34 is usually configured with a p-cladding layer and the p-contact layer. The p-contact layer may also serve as the p-cladding layer.

The p-cladding layer is not particularly limited as long as the band gap energy of the composition thereof is larger than that of the light emitting layer 33 and carriers can be confined within the light emitting layer 33, but is preferably composed of $Al_xGa_{1-x}N$ (0<x≤0.4). It is preferable that the p-cladding layer is composed of such AlGaN in terms of confinement of carriers within the light emitting layer 33.

The p-type doping concentration of the p-cladding layer is preferably $1\times10^{18}/cm^3$ to $1\times10^{21}/cm^3$, and more preferably $1\times10^{19}/cm^3$ to $1\times10^{20}/cm^3$.

The p-contact layer is preferably composed of $Al_xGa_{1-x}N$ (0≤x≤0.4). It is preferable that Al composition is in the above-described range in terms of allowing to maintain excellent crystallinity and good ohmic contact with a p-ohmic electrode. Moreover, it is preferable that the p-contact layer contains p-type impurities (dopant) with a concentration of $1\times10^{18}/cm^3$ to $1\times10^{21}/cm^3$, and preferably $5\times10^{19}/cm^3$ to $5\times10^{20}/cm^3$ in terms of maintaining good ohmic contact, preventing cracking and maintaining excellent crystallinity. The p-type impurities are not particularly limited, but, for example, Mg is preferably provided.

To form such an epitaxial layer 37 on the substrate 10, a method such as an MOCVD method (metalorganic chemical vapor deposition method), an HVPE method (hydride vapor phase epitaxy method), an MBE method (molecular beam epitaxy method), and a sputtering method can be used. As an especially preferred growing method, the MOCVD method is provided in terms of layer thickness controlling properties and volume productivity.

In the case of growing the group III nitride semiconductor by the MOCVD method, hydrogen ($H_2$) or nitrogen ($N_2$) is used as a carrier gas, trimethylgallium (TMG) or triethylgallium (TEG) is used as a source of Ga which is a group III raw material, trimethylaluminum (TMA) or triethylaluminum (TEA) is used as a source of Al, trimethylindium (TMI) or triethylindium (TEI) is used as a source of In, ammonia ($NH_3$), hydrazine ($N_2H_4$) or the like is used as a source of N which is a group V raw material. Further, as a dopant, for the n-type, monosilane ($SiH_4$) or disilane ($Si_2H_6$) is used as a raw material of Si, and organic germanium compounds are used as a Ge raw material, and for the p-type, bis(cyclopentadienyl)magnesium ($Cp_2Mg$) or bis(ethylcyclopentadienyl)magnesium (($EtCp)_2Mg$) is used as an Mg raw material.

After forming the epitaxial layer 37, at a predetermined position on the p-type layer 34 of the epitaxial layer 37, a transparent positive electrode 35 is formed by use of a known photolithographic technique and a lift-off technique as shown in FIG. 2C.

As a material of the transparent positive electrode 35, at least one selected from Au, NiO, ITO($In_2O_3$—$SnO_2$), AZO (ZnO—$Al_2O_3$), IZO($In_2O_3$—ZnO), and GZO(ZnO—$GeO_2$) or the like is used. Moreover, as the structure of the transparent positive electrode 35, any structure including those conventionally known can be used without any limitation.

Next, as shown in FIG. 2C, a positive electrode bonding pad 13b is formed at a predetermined position on the transparent positive electrode 35 by use of a known photolithographic technique. As the positive electrode bonding pad 13b, various kinds of structures using Au, Al, Ni, Cu and the like are known, and it is possible to use these known materials and structures without any limitation.

After forming the positive electrode bonding pad 13b, by use of known photolithographic technique and reactive ion etching technique, the epitaxial layer 37 is etched to form the dividing grooves 38a and 38b as shown in FIG. 2B, and to expose the n-contact layer of the n-type layer 32 in a semicircular shape at a predetermined position facing the dividing groove 38b.

It should be noted that, as a method for forming the dividing grooves 38a and 38b, other than the aforementioned etching method, any known method such as laser method and a dicing method can be used without any limitation.

However, as a method for forming the dividing grooves 38a and 38b, it is preferable to use the etching method such as wet etching and dry etching. For example, as the dry etching, methods such as reactive ion etching, ion milling, focused beam etching and ECR etching can be used, and in the wet etching, for example, mixed acid of sulfuric acid and phosphoric acid can be used. Prior to performing etching, a predetermined mask is formed on the surface of gallium nitride-based compound semiconductor so as to obtain a desired chip shape.

Further, in the case where the dividing grooves 38a and 38b are formed by the laser method, there is a possibility that dirt flies and adheres to the surface of the laminated semiconductor layer, and thereby the electrical properties are deteriorated. To prevent this, a protecting film made of a resist with excellent heat resistance or the like is formed, and after the dividing grooves are formed, the protecting film may be removed by washing together with the dirt adhered to the protecting film.

Further, in the dicing method, there is worry that unevenness of processing accuracy occurs due to consumption and deterioration of a blade; however, the processing accuracy can be improved by increasing replacing frequency of edges of the blade.

As shown in FIGS. 2A and 2B, the dividing grooves 38a that divide the substrate 10 into the light emitting chips 20 are provided to intersect the [1-100] direction (A plane, m-axis) of the sapphire single crystal that is in parallel with a surface of OF 11 with an angle α (crossing angle). The dividing grooves 38b are provided to intersect the [11-20] direction (M plane, a-axis) that is perpendicular to the surface of OF 11 with an angle β (crossing angle). Moreover, the dividing grooves 38a and 38b are provided to intersect each other. Consequently, plural light emitting elements 12, each of which has a substantially plan-view rectangular shape, are partitioned into a matrix state. In addition, expected cutting lines 21a and 21b to cut the substrate 10 into the light emitting chips 20 are provided along the dividing grooves 38a and 38b.

The crossing angle α (β) of the dividing grooves 38a and 38b are preferably in a range of 10° or more and 20° or less. Further, it is more preferable that the crossing angle α (β) is 15°. The reason will be mentioned briefly with reference to FIG. 2D.

FIG. 2D is diagram illustrating a relation between a side of the light emitting chip 20 and crystal orientation of a sapphire single crystal, and is a diagram of a surface of the light emitting chip 20 as viewed from the c-axis direction. Here, the planar shape of the light emitting chip 20 is indicated as a square. It should be noted that, as can be seen from FIGS. 2A and 2B, expected cutting planes 22a and 22b are in parallel relation with the expected cutting lines 21a and 21b, and the dividing grooves 38a and 38b.

In the case of α=0° (β=0°), one of the pairs of two parallel sides (expected cutting planes 22a) of the light emitting chip 20 coincides with the A plane, and the other of the pairs of two parallel sides (expected cutting planes 22b) coincides with the M plane.

Moreover, in the case of α=30° (β=30°), one of the pairs of two parallel sides (expected cutting planes 22a) of the light emitting chip 20 coincides with the M plane, and the other of the pairs of two parallel sides (expected cutting planes 22b) coincides with the A plane. Accordingly, in these cases, the side surfaces (cutting planes) of the substrate 10 of the light emitting chip 20 are inclined with respect to the substrate front surface 10a.

In contrast, for example, if α=15° (β=15°), the expected cutting planes 22a and 22b have an angle of 15° with respect to the A plane and the M plane, which is maximum.

Consequently, for suppressing inclination of the side surfaces (cutting planes) of the substrate 10 of the light emitting chip 20 with respect to the substrate front surface 10a, it is preferable that the crossing angles α and β are 15°. However, if the crossing angles α and β are in the range of 10° or more and 20° or less, it is possible to suppress inclination of the side surfaces (cutting planes) of the substrate 10 of the light emitting chip 20 with respect to the substrate front surface 10a. It should be noted that, since the sapphire single crystal is a hexagonal crystal, a value obtained by adding an integral multiple of 30° to each of the crossing angle α between the expected cutting plane 22a and the A plane and the crossing angle β between the expected cutting plane 22b and the M plane, namely, α (β) =30° x (n −1)+$α_o$ ($β_o$) (n is an integer, and 10° ≤$α_o$, $β_o$ ≤20°), provides the same result.

The plural light emitting chips 20 are, as shown in FIG. 2A, mutually provided at a spacing of ph (dividing pitch ph) in a direction of the crossing angle α with respect to the m-axis, and at a spacing of pv (dividing pitch pv) in a direction of the crossing angle β with respect to the a-axis.

In the exemplary embodiment, the surface shape of the light emitting chip 20 is rectangle, and the length of the long side ph is 400 μm, and the length of the short side pv is 240

µm; however, the directions of the long side and the short side may be either of them. Moreover, the light emitting chip 20 may be a square in which the long side and the short side have the same length.

The widths n1 and n2 of the dividing grooves 38a and 38b are, regardless of the size of the light emitting chip 20, preferably designed in a range of 10 µm to 30 µm, and more preferably, designed in a range of 15 µm to 25 µm. If they are 10 µm or less, many defective chips are generated when dividing is performed, in which the light emitting element 12 is damaged, and thereby production yields are reduced. Moreover, if they are 30 µm or more, the number of chips able to be obtained from one wafer is decreased, and it is undesirable in terms of productivity. Further, as long as the widths n1 and n2 are within the above-described range, the widths n1 and n2 may be the same or different.

Next, a negative electrode bonding pad 13a is formed on the n-contact layer of the n-type layer 32 that has been exposed.

As the negative electrode bonding pad 13a, various types of compositions using Ti, Au and the like and structures are known, these known compositions and structures can be used without any limitation, and the negative electrode bonding pad 13a can be provided by any well-known method in this technical field.

It should be noted that, though detailed description is omitted here, the light emitting element 12 is assumed to be a face-up type LED using the transparent positive electrode 35; however, the light emitting element 12 may be an LED of a face-down structure (flip-chip structure) that performs light extraction from the sapphire substrate side using a reflecting film. Moreover, the light emitting element 12 is assumed to be a light emitting diode; however, the light emitting element 12 may be a semiconductor laser.

After finishing to form the semiconductor light emitting elements, the substrate back surface 10b is ground to reduce the thickness of the substrate 10, and thereafter, polished to a mirror-smooth state.

It is preferable to make the thickness of the substrate 10 in a range of 60 µm to 300 µm, preferably 80 µm to 250 µm, and more preferably 100 µm to 200 µm. By making the thickness of the substrate 10 within the above-described range, it becomes easier to divide the substrate 10, and the substrate 10 can be divided with efficiency and neatly.

It should be noted that, if the thickness of the substrate 10 is more than 300 µm, it becomes difficult to accurately divide the substrate 10 made of sapphire or the like, which is very hard. Moreover, if the thickness of the substrate 10 is less than 60 µm, warping due to a difference in a lattice constant or thermal expansion coefficient between the substrate 10 and the epitaxial layer 37 becomes conspicuous, and thereby it becomes difficult to accurately divide the substrate 10.

Next, subsequent to the above-described production of the semiconductor light emitting element, a description will be given to a method for processing a substrate by which the substrate 10 is processed into the light emitting chips 20.

The method for processing a substrate in the exemplary embodiment is constituted by a laser processing step in which the modified regions 23 and 24 (refer to FIGS. 4A1 to 4B2, which will be described later) are formed (processed by laser) within the substrate 10 by irradiation of laser light, and thereafter, a breaking step in which the substrate 10 is cut into the light emitting chips 20 taking the modified regions 23 and 24 for the starting points.

The laser processing step, in which the modified regions 23 and 24 within the substrate 10 by laser processing, will be described.

FIGS. 3A to 3C are diagrams illustrating a state where the substrate 10 is bonded to an adhesive sheet 15 held by a metal ring 16 for forming the modified regions 23 and 24 within the substrate 10 by laser processing. FIG. 3A is a plan view illustrating a state where the substrate 10 is bonded to the adhesive sheet 15 held by the metal ring 16, FIG. 3B is a cross-sectional view taken along the line IIIB-IIIB in FIG. 3A, and FIG. 3C is a partially enlarged cross-sectional view of a cross section taken along the line IIIC-IIIC in FIG. 3A.

As shown in FIGS. 3A and 3B, the substrate 10 is bonded onto the adhesive sheet 15 supported by the metal ring 16.

The metal ring 16 is set larger than the diameter of the substrate 10. The substrate 10 is bonded inside the metal ring 16 not to contact the metal ring 16. It should be noted that the adhesive sheet 15 holds the substrate 10 in the laser processing, and prevents the light emitting chips 20 having been cut from flying off in the breaking step that is performed subsequent to the laser processing step.

In FIG. 3A, the substrate 10 is rotated by the crossing angle α so that the x direction is oriented to right and left in the figure.

In the substrate front surface 10a shown in FIG. 3A, an end in the −y direction where the OF 11 is provided is assumed to be a D-end portion, an end in the y direction opposite to the OF 11 is assumed to be a U-end portion, an end in the x direction is assumed to be an L-end portion, and similarly, an end in the left, −x direction is assumed to be an R-end portion. The center portion is assumed to be a C portion. Further, in the substrate front surface 10a shown in FIG. 3A, the lower portion of the substrate 10 where the D-end portion exists is referred to as a D-end portion side, the upper portion of the substrate 10 where the U-end portion exists is referred to as a U-end portion side, the right side of the substrate 10 where the L-end portion exists is referred to as an L-end portion side, and the left side of the substrate 10 where the R-end portion exists is referred to as an R-end portion side. It should be noted that, right and left of the R-end portion and the L-end portion are reversed in the figure. This is because the substrate 10 is arranged to be turned over in the laser processing step to be described later.

As shown in FIG. 3C, the substrate front surface 10a side of the substrate 10, where the light emitting elements 12 are formed, is bonded onto the adhesive sheet 15. Accordingly, FIG. 3A indicates a state in which the substrate front surface 10a is viewed through the adhesive sheet 15.

Moreover, as shown in FIG. 3C, planes extending perpendicular to the substrate front surface 10a from the expected cutting lines 21a (for the sake of convenience, supposed to be on the substrate back surface 10b) assumed on the substrate 10 are the expected cutting planes 22a corresponding to the expected cutting lines 21a. In other words, it is desirable to form the side surfaces (cutting planes) of the substrate 10 of the light emitting chip 20 to be perpendicular to the substrate front surface 10a.

Though not shown in the figure, planes extending perpendicular to the substrate front surface 10a from the substrate back surface 10b, which correspond to the expected cutting lines 21b perpendicular to the expected cutting lines 21a, become the expected cutting planes 22b.

Here, the substrate 10 bonded onto the adhesive sheet held by the metal ring 16 is referred to as a substrate unit 30.

FIGS. 4A1 to 4B2 are diagrams illustrating a method for forming the modified regions 23 and 24 within the substrate 10 by laser processing (laser processing method). FIGS. 4A1 and 4A2 indicate a step for forming the modified regions 23 at positions of a deep distance (distance d1) from the substrate back surface 10b from which the laser light 45 is incident.

FIGS. 4B1 and 4B2 indicate a step for forming the modified regions 24 at positions of a shallow distance (distance d2, d2<d1) from the substrate back surface 10b from which the laser light 45 is incident.

Hereinafter, a description will be given to the laser processing after the substrate unit 30, in which the substrate 10 is bonded onto the adhesive sheet 15 held by the metal ring 16, is placed on an adsorptive stage 52.

In the exemplary embodiment, a laser light generating unit 41 assumes the substrate back surface 10b as "0" (reference surface). Along the expected cutting lines 21a and 21b on the substrate back surface 10b, the positions of the distance d1 from the substrate back surface 10b (positions of a deep distance) are irradiated with focused laser light 45 to form the modified regions 23, and thereafter, along the expected cutting lines 21a and 21b on the substrate back surface 10b again, the positions of the distance (distance d2) that is shallow compared to the distance d1 are irradiated with the focused laser light 45 to form the modified regions 24. In other words, the laser light generating unit 41 forms modified regions 23 and 24 at plural distances from the substrate back surface 10b (substrate front surface 10a will bring the same result).

As described above, FIGS. 4A1 and 4A2 indicate a step for forming the modified regions 23 at the positions of a deep distance (distance d1) from the substrate back surface 10b. FIG. 4A1 is a cross-sectional view taken along the line IIIC-IIIC in FIG. 3A. In FIG. 4A1, there are shown the metal ring 16, the adhesive sheet 15, the substrate 10, which are set on the adsorptive stage 52, the light emitting elements 12 formed on the substrate front surface 10a, the expected cutting lines 21a assumed on the substrate 10, and the expected cutting planes 22a. It should be noted that only two expected cutting planes 22a are shown in FIG. 4A1.

On the other hand, FIG. 4A2 is a cross-sectional view taken along the line IIIB-IIIB in FIG. 3A.

As shown in FIG. 4A1, the laser light 45 is incident from the substrate back surface 10b, and in the expected cutting plane 22a, focused on the position of the distance d1 from the substrate back surface 10b by an optical system 44.

Then, as shown in FIG. 4A2, along with the movement of the adsorptive stage 52 toward the x direction, the laser light 45 repeatedly forms the plural modified regions 23 in the expected cutting planes 22a in the substrate 10 by pulse oscillation. The pulse oscillation frequency of the laser light 45 is, for example, 15000 Hz to 30000 Hz, and the moving speed of the adsorptive stage 52 is 100 mm/sec to 500 mm/sec.

In addition, the laser output is in a range of 1.5 µJ to 5.0 µJ.

As described above, FIGS. 4B1 and 4B2 indicate the step for forming the modified regions 24 at positions of a shallow distance (distance d2, d2<d1) from the substrate back surface 10b. FIG. 4B2 is a cross-sectional view taken along the line IIIB-IIIB in FIG. 3A. The cross sections shown in FIGS. 4B1 and 4B2 are the cross sections shown in FIGS. 4A1 and 4A2, respectively. Accordingly, as shown in FIGS. 4B1 and 4B2, the modified regions 23 have already been formed at the positions of the distance d1 from the substrate back surface 10b within the substrate 10.

As shown in FIG. 4B1, the laser light 45 is focused on the positions of the distance d2 (d2<d1) from the substrate back surface 10b. Then, as shown in FIG. 4B2, along with the movement of the adsorptive stage 52 toward the x direction, the laser light 45 repeatedly forms the plural modified regions 24 by pulse oscillation.

As described so far, the modified regions 23 and 24 are formed by locating a focal point at the positions of two different distances from the substrate back surface 10b (substrate front surface 10a) in the expected cutting planes 22a assumed in the substrate 10. In other words, in the expected cutting planes 22a of the substrate 10, the modified regions 23 and the modified regions 24 are formed in two stages.

Though not shown in FIGS. 4A1 to 4B2, the same applies to the expected cutting planes 22b. In the exemplary embodiment, as the scanning order in the x direction and in the y direction, the modified regions 23 and 24 are formed in the x direction, and thereafter, the modified regions 23 and 24 are formed in the y direction. Moreover, the outputs of the laser in forming the modified regions 23 and 24 were 2.5 µJ and 2.0 µJ, respectively, that is, the output of the laser light 45 in the case of the longer distance from the substrate back surface 10b was set larger than in the case of the shorter distance.

The modified regions 23 and 24 are regions in which cracking are formed or melted regions by the focused intense laser light 45, and are regions having low mechanical strength compared to regions that are not irradiated with the laser light 45. Consequently, in the breaking step to be performed subsequent to the laser processing step, by pressing a blade or the like, the modified regions 23 and 24 become the starting points from which the substrate 10 is easily broken and cutting of the substrate 10 is initiated.

In other words, formation of the modified regions 23 and 24 in two stages within the substrate 10 makes it possible to cut the substrate 10 into light emitting chips 20.

It should be noted that, in the exemplary embodiment, after forming the modified regions 23 at the deep positions (distance d1) from the substrate back surface 10b, the modified regions 24 are formed at the shallow positions (distance d2). In other words, formation of the modified regions 23 and 24 are performed from the positions of the long distance to those of the short distance from the substrate back surface 10b on which the laser light 45 is incident. The reason is as follows. If the modified regions 23 are to be formed at the deep positions (distance d1) after the modified regions 24 are formed at the shallow positions (distance d2), the laser light 45 transmits the modified regions 24 formed at the shallow positions (distance d2) and is focused on the deep position (distance d1). In this case, the laser light 45 suffers the effect such as scattering from the modified regions 24. Therefore, focusing efficiency of the laser light 45 is insufficient, and it becomes hard to form the modified regions 23.

Thereafter, by pressing a blade against the expected cutting lines 21a and 21b having been assumed, the breaking step for cutting the substrate 10 into light emitting chips 20 is performed. In the breaking step, cracking occurs in the substrate 10 from the modified regions 23 and 24 having been formed as the starting points, and thereby the substrate 10 is cut into the light emitting chips 20.

After that, the adhesive sheet 15 is expanded to broaden the spacing between each light emitting chip 20, to thereby makes it easy to perform operations in a package mounting step (not shown) for mounting the light emitting chip 20 onto a package.

(Second Exemplary Embodiment)

In the first exemplary embodiment, as shown in FIG. 2A, the surface shape of the light emitting chip 20 was assumed to be a rectangle. Accordingly, the crossing angle α with respect to the A plane (11-20) and the crossing angle β with respect to the M plane (1-100) were not able to be set individually.

Figure 5:
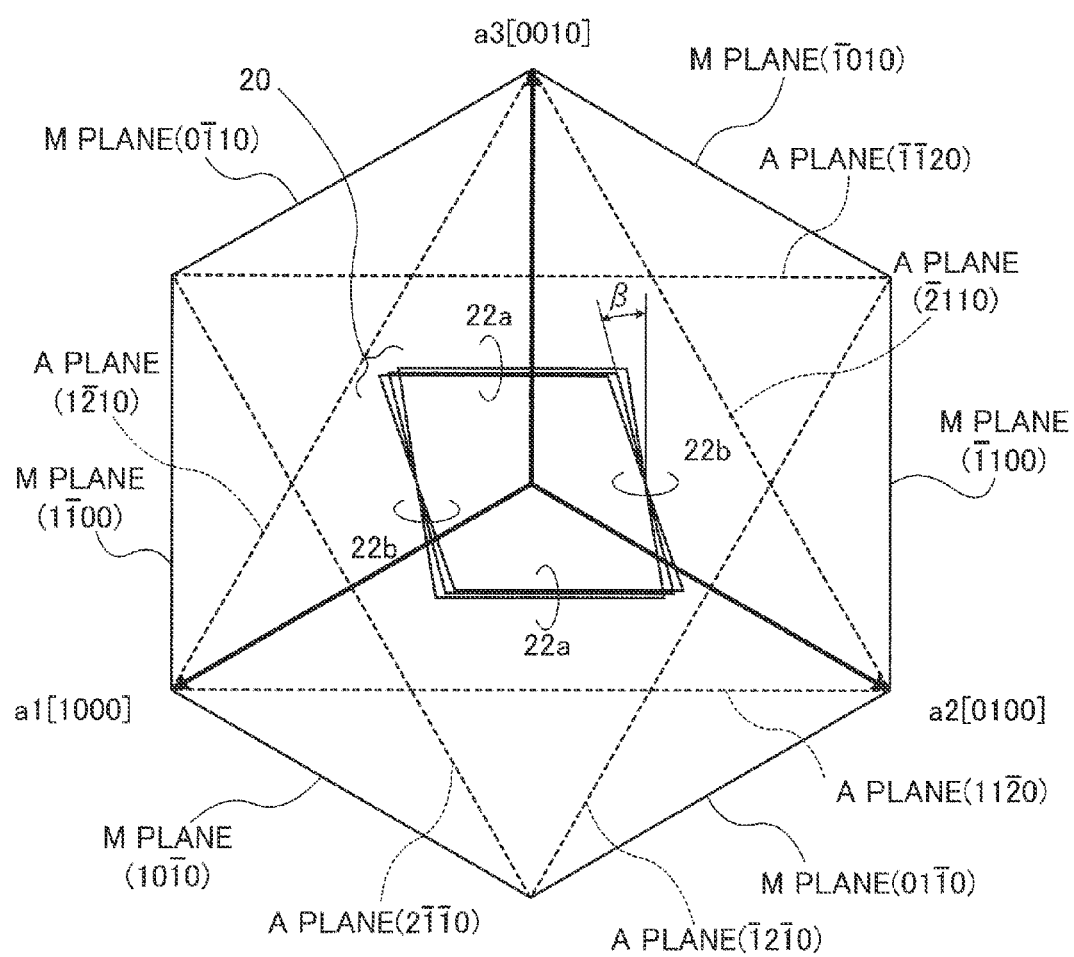
FIG. 5 is a diagram illustrating a relation between a side of a light emitting chip and crystal orientation of a sapphire single crystal in a second exemplary embodiment.

FIG. 5 is a diagram illustrating a relation between the sides of the light emitting chip 20 and crystal orientation of the sapphire single crystal in a second exemplary embodiment. Here, the surface shape of the light emitting chip 20 is assumed to be a parallelogram, and one of pairs of two parallel sides (expected cutting planes 22a) of the light emitting chip 20 is set in parallel (α=0°) with the A plane. On the other hand, there are shown the cases where the crossing angle β between the other one of pairs of two parallel sides (expected cutting planes 22b) of the light emitting chip 20 and the M plane is set to be 10°, 15° and 20°. It should be noted that α may not be 0°.

Figure 6:
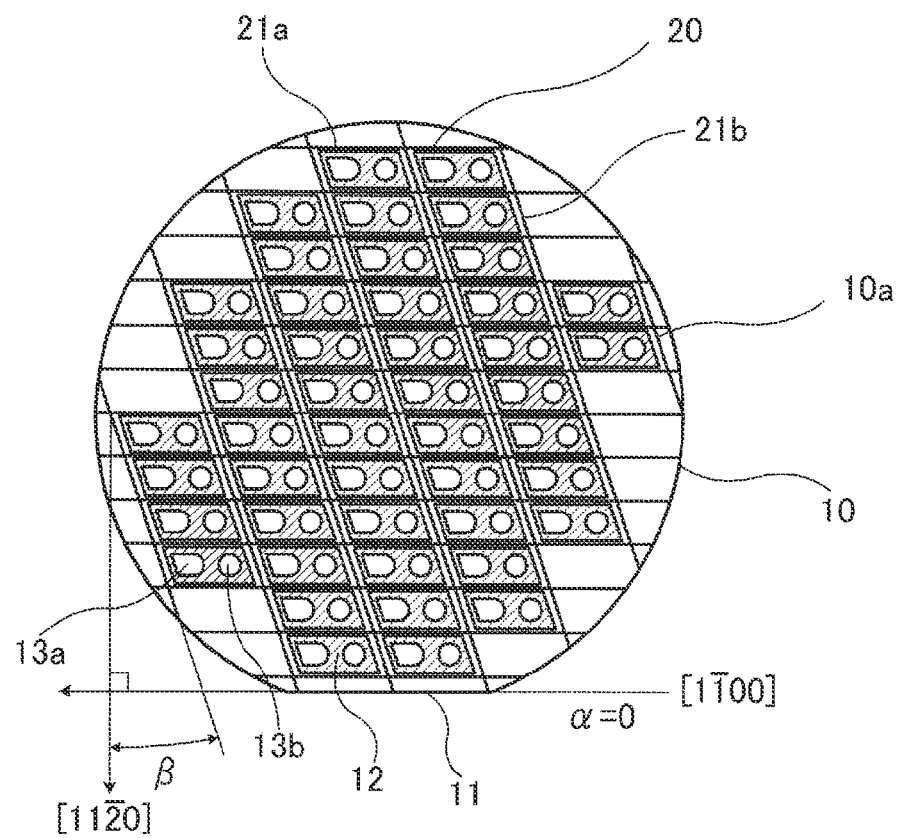
FIG. 6 is a diagram illustrating an example of a substrate in the second exemplary embodiment.

FIG. 6 is a diagram illustrating an example of the substrate 10 in the second exemplary embodiment. In FIG. 6, the expected cutting lines 21a (expected cutting planes 22a) of the substrate 10 and the [1-100] direction (A plane) of the sapphire single crystal are caused to coincide with each other, and the expected cutting lines 21b (expected cutting planes 22b) and the [11-20] direction (M plane) of the sapphire single crystal are caused to intersect at the angle of β=15°.

Others are similar to those of the first exemplary embodiment. In this manner, in the second exemplary embodiment, the expected cutting planes 22a coincide with the A plane; however, since the A plane has a tendency to break vertically, there is no possibility that the side surfaces of the substrate 10 are inclined. Moreover, in the second exemplary embodiment, it is possible to set the crossing angle α with respect to the A plane (11-20) and the crossing angle β with respect to the M plane (1-100) individually upon assuming the plane shape of the light emitting chip 20 as a parallelogram.

Then, in the exemplary embodiment like this, since the expected cutting planes 22a and 22b intersect the M plane, it is possible to suppress inclination of the side surfaces (cutting planes) of the substrate 10 in the light emitting chip 20 with respect to the substrate front surface 10a.

(Third Exemplary Embodiment)

In the second exemplary embodiment, as shown in FIG. 6, the surface shape of the light emitting chip 20 was assumed to be a parallelogram. In the third exemplary embodiment, the surface shape of the light emitting chip 20 is assumed to be a trapezoid.

Figure 7:
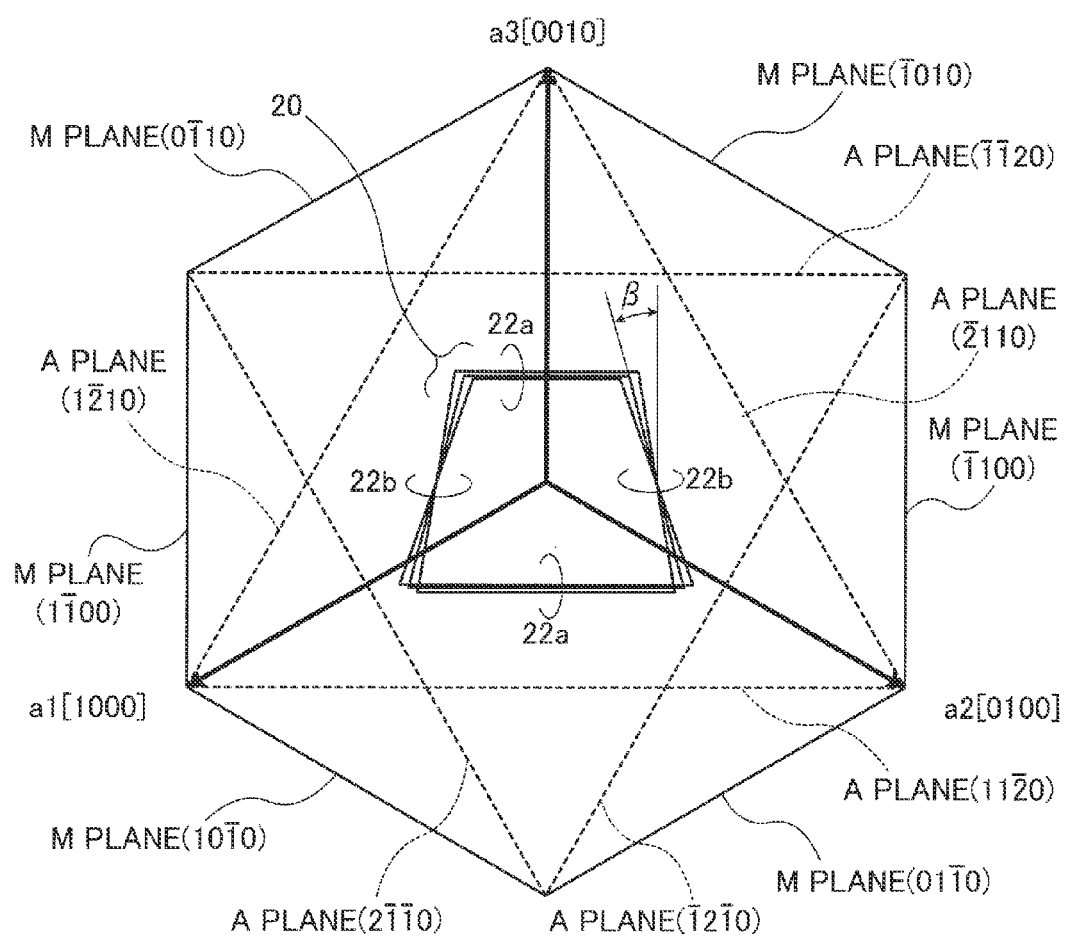
FIG. 7 is a diagram illustrating a relation between a side of a light emitting chip and crystal orientation of a sapphire single crystal in a third exemplary embodiment.

FIG. 7 is a diagram illustrating a relation between the sides of the light emitting chip 20 and crystal orientation of the sapphire single crystal in the third exemplary embodiment. Here, the surface shape of the light emitting chip 20 is assumed to be an isosceles trapezoid having legs of the same length, and one of pairs of two parallel sides (expected cutting planes 22a) of the light emitting chip 20 is set in parallel (α=0°) with the A plane. On the other hand, there are shown the cases where the crossing angle β between the other one of pairs of two sides (expected cutting planes 22b) of the light emitting chip 20 and the M plane is set to be 10°, 15° and 20°. It should be noted that α may not be 0°.

Figure 8:
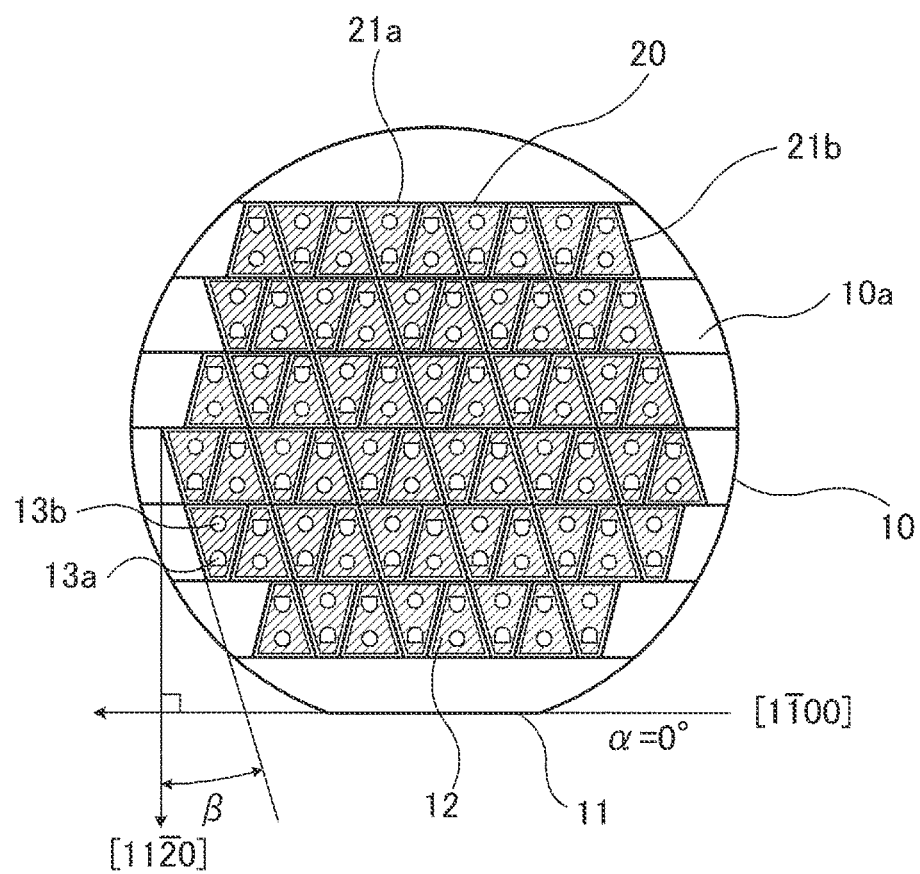
FIG. 8 is a diagram illustrating an example of a substrate in the third exemplary embodiment.

FIG. 8 is a diagram illustrating an example of the substrate 10 in the third exemplary embodiment. In FIG. 8, the expected cutting lines 21b (expected cutting planes 22b) of the substrate 10, which correspond to the two legs of the trapezoid of the light emitting chip 20, are provided to intersect the [11-20] direction (M plane) of the sapphire single crystal at the crossing angle β=15°. On the other hand, the expected cutting lines 21a (expected cutting planes 22a) of the substrate 10 are provided in the [1-100] direction (A plane) of the sapphire single crystal.

It should be noted that, in the exemplary embodiment, the expected cutting lines 21a are straight lines in the substrate 10; however, the expected cutting lines 21b are not straight lines. Accordingly, in the expected cutting lines 21a, the substrate 10 is cut into a rectangular shape, and thereafter, cut into the light emitting chips 20 along the expected cutting lines 21b. Moreover, the modified regions 23 and 24 (refer to FIG. 3) may be formed along the expected cutting lines 21a and 21b by moving the adsorptive stage 52 (refer to FIGS. 3A to 3C) in accordance with the expected cutting lines 21a and 21b.

In the exemplary embodiment, the isosceles trapezoid was assumed, but the lengths of the legs may be different. Further, not shown in the figure, the surface shape of the light emitting chip may be a triangle.

Others are similar to those of the first exemplary embodiment.

Also in the exemplary embodiment, as shown in FIG. 7, since the expected cutting planes 22a and 22b intersect the M plane, it is possible to suppress inclination of the side surfaces (cutting planes) of the substrate 10 in the light emitting chip 20 with respect to the substrate front surface 10a.

As has been described in the first to third exemplary embodiments, the sides (expected cutting planes 22a and 22b) of the light emitting chip 20 only have to be provided to intersect the M plane. In the present invention, the relation between the sides (expected cutting planes 22a and 22b) of the light emitting chip 20 and the M plane not limited to those described in the exemplary embodiment; however, can be used with variation.

Similarly, in the present invention, the surface shape of the light emitting chip 20 is not limited to those described in the exemplary embodiment; however, can be used with variation.

In addition, in the first to third exemplary embodiments, the OF 11 was provided on the (11-20) plane (A plane) of the sapphire single crystal. However, the OF 11 may be provided in parallel with any one of the expected cutting lines 21a (expected cutting planes 22a) and the expected cutting lines 21b (expected cutting planes 22b). If the OF 11 is provided in parallel with any one of the expected cutting lines 21a (expected cutting planes 22a) and the expected cutting lines 21b (expected cutting planes 22b), the light emitting elements 12 may be formed on the substrate 10 with reference to the OF 11. Consequently, the process for forming the light emitting elements 12 becomes easier.

In the first to third exemplary embodiments, as the laser for forming the modified regions 23 and 24 within the substrate 10, the second harmonic of an Nd-YAG laser can be used, and moreover, the third or fourth harmonic thereof may also be used, and further, the fundamental of 1064 nm may be used. In addition, the fundamental or harmonics of an Nd-YLF laser or an Nd-YVO4 laser, and a Ti-sapphire laser may be used. Moreover, in the present invention, not only solid lasers, but also a gas laser such as excimer-excited pulse laser light or a C02 laser may be used.

Further, in the first to third exemplary embodiments, the modified regions 23 and 24 may be formed in two stages with the focusing distance of the laser light 45 from the substrate back surface 10b being changed. Moreover, only one of the modified regions 23 and 24 may be formed (in one stage), and further, the modified regions may be formed in three stages. Further, the modified regions of different number of stages may be formed with respect to each of the expected cutting planes 22a and 22b.

The scanning order of the x direction and the y direction in the exemplary embodiment was that the x direction to be the first and the y direction to be the next; however, the order may be reversed so that the y direction to be the first and the x direction to be the next. Further, in the exemplary embodiment, scanning of the laser light 45 was multiply performed in one direction; however, scanning may be performed alternately in the x direction and in the y direction.

In the exemplary embodiment, the output of the laser light 45 was changed in accordance with the distance from the substrate back surface 10b; however, the output may be the same, or, the output of the laser light 45 in the case of the long distance from the substrate back surface 10b may be set smaller than that in the case of the short distance.

As has been described in the first to third exemplary embodiments, according to the present invention, a method for processing a substrate, in which a C plane ((0001) plane) of a sapphire single crystal is assumed to be a front surface, and plural semiconductor light emitting elements are formed on the front surface, is provided, the method including: a step in which planes that are perpendicular to the front surface of the substrate and intersect any of planes equivalent to an M plane of the sapphire single crystal are assumed as expected cutting planes, and dividing grooves are formed in interelement spacings between light emitting elements along the expected cutting planes; a laser processing step in which laser light is focused and applied in the expected cutting plane from one surface of the substrate to form modified regions within the substrate; and a breaking step in which the substrate is cut from the modified regions as starting points and divided into plural semiconductor light emitting chips, each of which includes the semiconductor light emitting element.

Here, the expected cutting plane is a plane perpendicular to the surface of the substrate and intersects any planes equivalent to the M plane of the sapphire single crystal. It should be noted that, in the present invention, "perpendicular plane" with respect to the surface of the substrate includes a range of planes that are almost perpendicular to the surface of the substrate. For example, as the preferred range of almost perpendicular plane, perpendicular planes are assumed including a range within 2° with respect to the surface of the substrate. Hereafter, detailed description will be given with Examples.

EXAMPLES

Hereinafter, the present invention will be specifically described based on Examples. However, the present invention is not limited only to these Examples.

Example 1

As shown below, group III nitride semiconductor light emitting element having a light emitting element that includes a gallium nitride-based compound semiconductor was prepared.

First, as shown in FIG. 2C, on the substrate front surface 10a of the substrate 10 of a C-plane single crystal sapphire having a shape of a circular disc with an outer diameter of 100 mm (off angle; 0.4°), via the buffer layer composed of MN, the epitaxial layer 37 composed of the group III nitride semiconductor with a thickness of 9 μm was formed by sequentially laminating the base layer composed of undoped GaN with a thickness of 4 μm, the n-contact layer composed of Si-doped (concentration of $1\times10^{19}/cm^3$) GaN with a thickness of 2 μm, the n-cladding layer composed of Si-doped (concentration of $1\times10^{18}/cm^3$) $In_{0.1}Ga_{0.9}N$ with a thickness of 12.5 nm (the n-type layer 32 is configured with the n-contact layer and the n-cladding layer), the light emitting layer 33 having a multiple quantum well structure that includes the barrier layer composed of GaN with a thickness of 16 nm and the well layer composed of $In_{0.2}Ga_{0.8}N$ with a thickness of 2.5 nm, which were laminated five times, and is finally provided with the barrier layer, the p-cladding layer composed of Mg-doped (concentration of $1\times10^{20}/cm^3$) $Al_{0.07}Ga_{0.93}N$ with a thickness of 2.5 nm and the p-contact layer composed of Mg-doped (concentration of $8\times10^{19}/cm^3$) GaN with a thickness of 0.15 μm (the p-type layer 34 is configured with the p-contact layer and the p-cladding layer). It should be noted that the OF 11 (orientation flat) is formed on the A plane of the substrate 10 composed of the sapphire single crystal.

Next, at a predetermined position on the p-contact layer of the epitaxial layer 37, the transparent positive electrode 35 composed of IZO was formed by use of a known photolithographic technique and a lift-off technique.

Next, the positive electrode bonding pad 13b having a Ti/Al/Ti/Au structure was formed on the transparent positive electrode 35 by use of the known photolithographic technique.

Next, as shown in FIGS. 2A to 2D, the epitaxial layer 37 on which the positive electrode bonding pad 13b was lastly formed was etched by use of known photolithographic technique and reactive ion etching technique to form the dividing grooves 38a with the dividing pitch pv of 240 μm and the width n1 of 20 μm along the expected cutting lines 21a forming the crossing angle α of 15° with the A plane of the sapphire single crystal and the dividing grooves 38b with the dividing pitch ph of 400 μm and the width n2 of 20 μm along the expected cutting lines 21b forming the crossing angle β of 15° with the M plane of the sapphire single crystal. Moreover, at the same time, the n-contact layer was exposed in a semicircular shape at a predetermined position facing toward the dividing groove 38b.

Next, negative electrode bonding pad 13a having a two-layer structure of Ti/Au was formed on the exposed n-contact layer by a known method.

With the above steps, a wafer for light emitting element (the substrate 10 on which the semiconductor light emitting elements were formed) having plural light emitting elements 12 separated by the dividing grooves 38a and 38b was prepared.

Next, by lapping and polishing the substrate back surface 10b, the substrate 10 composed of the sapphire single crystal was made into a thin plate so that a total thickness including the thickness of the epitaxial layer 37 and the thickness of the substrate 10 became 150 μm. Ra of the substrate back surface 10b, which is a surface on which no light emitting element 12 was formed, was set to 0.005 μm. On a surface of the wafer having been obtained, no dirt was observed by visual inspection.

Next, in the laser processing step of the method for processing a substrate, two positions (two stages) of the distance d1=100 μm and the distance d2=30 μm from the substrate back surface 10b were irradiated with the laser light 45 to form the modified regions 23 and 24.

Next, a cleaving blade was brought into contact with the substrate back surface 10b along the dividing groove 38b, and further, pressed into the substrate 10 by 40 μm, to thereby cause the cracking from the modified regions 23 and 24 of the dividing groove 38b. Consequently, the wafer was divided into the rectangular shape along the dividing grooves 38b, and thereby rectangular-shaped wafers having a single-row array of the light emitting elements 12 were obtained.

Next, the cleaving blade was brought into contact with the substrate back surface 10b along the dividing groove 38a and pressed into the substrate 10 by 40 μm, to thereby cause the cracking from the modified regions 23 and 24 of the dividing groove 38a. In this manner, the rectangular-shaped wafers were divided along the dividing grooves 38a to provide plural group III nitride semiconductor light emitting elements having a substantially plan-view rectangular shape (light emitting chips 20) with a long side length of 400 μm and a short side length of 240 μm.

LED properties of the light emitting chips 20 obtained in Example 1 were, when the voltage Vf is 3.11V, light emission wavelength of 452 nm and light emission output of 18.5 mW.

Figure 9A:
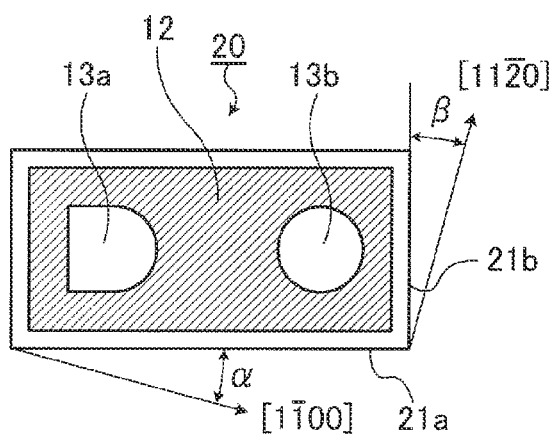
FIGS. 9A to 9C are diagrams illustrating a shape of the light emitting chip in Examples.
Figure 9C:
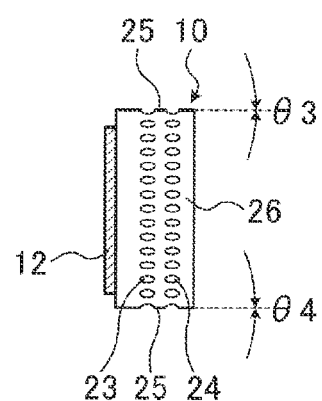
Figure 9B:
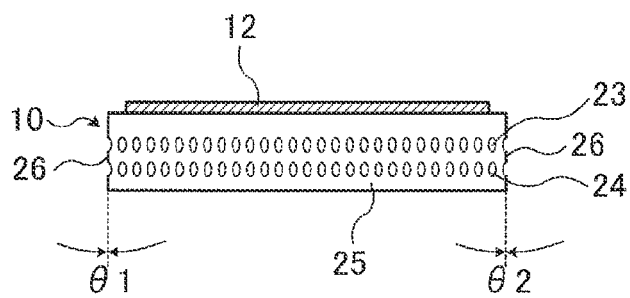

FIGS. 9A to 9C are diagrams illustrating a shape of the light emitting chip 20 in Example 1. FIG. 9A is a plan view of the light emitting chip 20 in Example 1 as viewed from above, FIG. 9B is a side view of the light emitting chip 20 as viewed from the long side direction, and FIG. 9C is a side view of the light emitting chip 20 as viewed from the short side direction.

Then, with reference to a plane perpendicular to the substrate front surface 10a, measurement and evaluation were performed for inclination angles of the side surfaces 26 of the short side direction as viewed from the long side direction of the light emitting chip 20, while regarding the angle in the left side in the figure as the inclination angle θ1 and the angle in the right side in the figure as the inclination angle θ2, as shown in FIG. 9B, and inclination angles of the side surfaces 25 of the long side direction as viewed from the short side direction of the light emitting chip 20, while regarding the angle in the upper side in the figure as the inclination angle θ3 and the angle in the lower side in the figure as the inclination angle θ4, as shown in FIG. 9C. As a result, the inclination angles θ1 and θ2 of the side surfaces 26 in the short side direction were 0.5° and 0.4°, in either of which the inclination angle of the cutting plane was 2° or less, and thereby the cutting planes were perpendicular to the substrate front surface. Moreover, the inclination angles θ3 and θ4 of the side surfaces 25 in the long side direction of the light emitting chip 20 were 0.3° and 0.4°, in either of which the inclination angle of the cutting plane was 2° or less, and thereby the cutting planes were perpendicular to the substrate front surface.

Next, as a result of performing evaluation, in which 5V as a reverse voltage Vr was applied to the light emitting elements 12 of the plural light emitting chips 20 and those having reverse current Ir of 2 μA or more was regarded as failure (NG; No Good), failure (NG) rate was 0.3%.

Examples 2 to 6, Comparative Examples 1 and 2

FIG. 10 further shows the dividing pitches ph and pv, the widths n1 and n2 of the dividing grooves 38a and 38b, the crossing angles α and β with respect to the A plane and the M plane of the sapphire single crystal, the distances d1 and d2 from the substrate back surface 10b to the modified regions 23 and 24 formed by laser irradiation, the inclination angles θ1 and θ2 of the side surfaces 26 in the short side direction of the light emitting chip 20, the inclination angles θ3 and θ4 of the side surfaces 25 in the long side direction, the result of failure (NG) rate in Examples 2 to 6 and Comparative Examples 1 and 2.

However, the structure of the light emitting elements 12 in Examples 2 to 6 is the same as that in Example 1 except for the setting of the widths of the dividing grooves and the crossing angles α and β, and further, the laser processing step in the method for processing a substrate is the same as Example 1.

FIGS. 11A to 11D are diagrams illustrating a shape of the light emitting chip 20 in Comparative Examples 1 and 2.

The structure of the light emitting elements 12 in Comparative Examples 1 and 2 is the same as that in Example 1 except that the light emitting chip 20 is prepared in a rectangular shape by causing the expected cutting lines 21a and the A plane of the sapphire single crystal to coincide with each other (crossing angle α=0°) and the expected cutting lines 21b and the M plane of the sapphire single crystal to coincide with each other (crossing angle β=0°), and that the widths n1 and n2 of the dividing grooves 38a and 38b are 30 μm, and the surface shape of the light emitting chip 20 is also the same as that in Example 1. Further, the laser processing step in the method for processing a substrate is also the same as Example 1.

As can be seen from FIG. 10, in Examples 1 to 6, the inclination angles θ1 and θ2 of the side surfaces 26 in the short side direction of the light emitting chip 20 were 2° or less in any of Examples, and therefore, the cutting planes were perpendicular to the substrate front surface 10a. In addition, the inclination angles θ3 and θ4 of the side surfaces 25 in the long side direction of the light emitting chip 20 were also 2° or less, and accordingly, cross sections of the chip perpendicular to the surface of the substrate can be obtained. Moreover, in Examples 1 to 6, the failure (NG) rate is 1% or less, which is favorable.

In contrast, in Comparative Examples 1 and 2, both of the inclination angles θ1 and θ2 of the side surfaces 26 in the short side direction, namely, in parallel with the M plane, of the light emitting chip 20 are in the neighborhood of 5°, and as shown in FIG. 11D, the side surfaces 25 of the substrate 10 are parallelogram as the light emitting chip 20 is viewed from the long side direction. On the other hand, the inclination angles θ3 and θ4 of the side surfaces 25 in the long side direction were 2° or less, and thereby the cutting planes were perpendicular to the substrate front surface 10a. As shown in FIG. 11C, the side surfaces 26 are rectangular as the light emitting chip 20 was viewed from the short side direction. That is, the side surfaces 26 in the short side direction are inclined with respect to the substrate front surface 10a. The failure (NG) rate in Comparative Example 1 is 9.5% and that in comparative Example 2 is 3.2%, which are significantly high values compared to Examples 1 to 6.

As is learned from the above description, in Examples 1 to 6, since inclination of the side surfaces 25 and 26 of the substrate 10 of the light emitting chip 20 with respect to the substrate front surface 10a is suppressed, deviation of the cutting planes (side surfaces 25 and 26) of the substrate 10 of the light emitting chip 20 from cutting regions to be laid across the light emitting elements 12 is suppressed, and thereby it was possible to keep the failure rate low.

INDUSTRIAL APPLICABILITY

The present invention relates to a method for producing a semiconductor light emitting element, in particular, relates to a method for producing a semiconductor light emitting element, which suppresses obliquely breaking of a sapphire substrate when being divided, and also suppresses reverse current, to thereby increase productive efficiency, and accordingly, there is availability of the present invention in an industry that produces and utilizes semiconductor light emitting elements.

REFERENCE SIGNS LIST

10 . . . Substrate
11 . . . Orientation flat (OF)
12 . . . Light emitting element
13a, 13b . . . Electrode
15 . . . Adhesive sheet
16 . . . Metal ring
020 . . . Light emitting chip
21a, 21b . . . Expected cutting line
22a, 22b . . . Expected cutting plane
30 . . . Substrate unit
32 . . . N-type layer
33 . . . Light emitting layer
34 . . . P-type layer

35 ... Transparent positive electrode
37 ... Epitaxial layer
38a, 38b ... Dividing groove
41 ... Laser light generating unit
42 ... Dichroic mirror
44 ... Optical system
45 ... Laser light
52 ... Adsorptive stage

The invention claimed is:

1. A semiconductor light emitting chip comprising:
a substrate in which a C plane of a sapphire single crystal is assumed to be a front surface, and a side surface is configured with a plane that intersects any of planes equivalent to an M plane of the sapphire single crystal, the substrate including modified regions formed by laser irradiation in the side surface; and
a semiconductor light emitting element provided on the front surface of the substrate,
wherein, in the front surface of the substrate, a crossing angle of the side surface intersecting the M plane of the sapphire single crystal is 10° or more and 20° or less.

2. The semiconductor light emitting chip according to claim 1, wherein a surface shape of the semiconductor light emitting chip is a parallelogram.

3. The semiconductor light emitting chip according to claim 1, wherein a surface shape of the semiconductor light emitting chip is a trapezoid.

* * * * *